United States Patent
Kabir et al.

(10) Patent No.: US 6,346,452 B1
(45) Date of Patent: Feb. 12, 2002

(54) METHOD FOR CONTROLLING AN N-TYPE DOPANT CONCENTRATION DEPTH PROFILE IN BIPOLAR TRANSISTOR EPITAXIAL LAYERS

(75) Inventors: Abul Ehsanul Kabir, Belmont, CA (US); Rashid Bashir, Lafayette, IN (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/303,957

(22) Filed: May 3, 1999

(51) Int. Cl.[7] ............................................. H01L 21/8222
(52) U.S. Cl. ........................ 438/312; 257/19; 257/197
(58) Field of Search ................................. 438/222, 226, 438/234, 235, 312, 313, 341, 357, 363, 369, 315; 257/19, 197

(56) References Cited

U.S. PATENT DOCUMENTS 5,583,370 A  12/1996  Higgins, III et al. ....... 257/667

OTHER PUBLICATIONS

Harame, D.L., et al. "Si/SiGe Epitaxial–Base Transistors—Part I: Materials, Physics, and Circuits," IEEE Transactions on Electron Devices, vol. 42, No. 3, Mar. 1995, pp. 455–468.
Kamins, T.I., et al. "Control of n–Type Dopant Transitions in Low–Temperature Silicon Epitaxy," J. Electrochem. Soc., vol. 144, No. 2, Feb. 1997 (Copyright: The Electrochemical Society, Inc.) pp. 674–678.
Harame, D.L., et al. "Si/SiGe Epitaxial–Base Transistors—Part II: Process Integration and Analog Applications," IEEE Transactions on Electron Devices, vol. 42, No. 3, Mar. 1995, pp. 469–482.

*Primary Examiner*—Mary Wilczewski
(74) *Attorney, Agent, or Firm*—Stallman & Pollock LLP

(57) ABSTRACT

Process for the formation of epitaxial layers with controlled n-type dopant concentration depth profiles for use in NPN bipolar transistors. The process includes first providing a semiconductor substrate (e.g. a [100]-oriented silicon wafer substrate) with an n-type collector precursor region formed on its surface, followed by forming an n-type (e.g. phosphorous or arsenic) in-situ doped epitaxial layer of a thickness $t_1$ on the n-type collector precursor region. Next, an undoped epitaxial layer of a thickness $t_2$ is formed on the n-type in-situ doped epitaxial layer. A p-type (e.g. boron) in-situ doped epitaxial base layer is subsequently formed on the undoped epitaxial layer. The process can also include the sequential formation of an undoped $Si_{1-x}Ge_x$ epitaxial layer and a p-type in-situ doped $Si_{1-x}Ge_x$ epitaxial layer between the undoped epitaxial layer and the p-type in-situ doped epitaxial base layer. Accumulation of the n-type dopant concentration in p-type epitaxial layers (such as the p-type in-situ doped epitaxial base layer or the p-type in-situ doped $Si_{1-x}Ge_x$ epitaxial layer) that are formed subsequent to a non-p-type epitaxial layer (such as the undoped epitaxial layer or undoped $Si_{1-x}Ge_x$ epitaxial layer, respectively) is controlled by manipulating the thickness ratio of $t_2$ to $t_1$, while keeping the thickness of N-layer fixed at t (i.e. $t_1+t_2$).

12 Claims, 6 Drawing Sheets

METHOD FOR CONTROLLING AN N-TYPE DOPANT CONCENTRATION DEPTH PROFILE IN BIPOLAR TRANSISTOR EPITAXIAL LAYERS

BACKGROUND OF THE INVENTION

1. Field of the Invention

The present invention relates to bipolar transistor manufacturing methods and, in particular, to methods for controlling an N-type dopant concentration into the subsequent P-type base layer grown epitaxially right after the N-layer growth.

2. Description of the Related Art

Silicon (Si) and Silicon/Silicon-Germanium (Si/SiGe) epitaxial-base layers are commonly employed in bipolar junction transistors (BJTs) and heterojunction bipolar transistors (HBT's), respectively. When these transistors are to be used in high frequency performance wireless, radio-frequency (RF) and communication devices, their small-signal unity gain frequency ($f_T$) and maximum oscillation frequency ($f_{max}$) performance can be in excess of 40 GHz. See, for example, D. L. Harame, et al., *Si/SiGe Epitaxial-Base Transistors-Part I: Materials, Physics, and Circuits*, in IEEE Transactions on Electron Devices, Vol. 42, No. 3, pp. 455–486 (March, 1995) and D. L. Harame, et al., *Si/SiGe Epitaxial-Base Transistors-Part II: Process Integration and Analog Applications*, in IEEE Transactions on Electron Devices, Vol. 42, No. 3, pp. 469–482 (1995), both of which are hereby incorporated by reference, for a further discussion of the science and technology of epitaxial-base BJT's and HBT's.

Attaining high frequency performance in BJT's and HBT's requires optimization and control of the dopant concentration depth profile in both the base region and the underlying collector region. For example, in the base/collector structure of an NPN BJT or HBT, it is desirable to control the n-type phosphorus (or arsenic) dopant concentration depth profile in regions immediately underlying a p-type base layer.

Unfortunately, the use of dopant ion implantation and thermal drive-in processes for the doping of bipolar transistor epitaxial layers can result in undesirable implant channeling and unacceptably wide and non-abrupt dopant concentration depth profiles in the base region. Furthermore, when phosphorus in-situ doped epitaxial layers are used as a portion of the collector region in high-frequency epitaxial base layer BJT's or HBT's, phosphorus is observed to unintentionally accumulate in overlying p-type layers (i.e. boron-doped silicon and boron-doped SiGe layers), thereby increasing the n-type dopant concentration in the p-type layers to an undesirable level.

The abruptness of arsenic and phosphorus dopant concentration during the onset of in situ doped silicon epitaxy has been reported in the literature. See T. I. Kamins and D. Lefforge, "Control of n-Type Dopant Transitions in Low-Temperature Silicon Epitaxy" *J. Electrochemical* Soc., Vol 144, No. 2, pp. 674–678 (Feb. 1997), which is hereby fully incorporated by reference. Methods for controlling the n-type dopant concentration depth profile in undoped or p-type doped epitaxial layers formed subsequent to an n-type in-situ doped epitaxial layer are, however, not known in the art.

Still needed is a method for the formation of NPN bipolar transistor epitaxial layers, including undoped or p-type doped epitaxial layers formed subsequent to an n-type in-situ doped epitaxial layer, with a controlled n-type dopant concentration depth profile.

SUMMARY OF THE INVENTION

FIG. 1 is a cross-sectional representation of a portion of an NPN BJT 100 that includes a semiconductor substrate 102, an n-type collector precursor region 104 formed on the surface of the silicon substrate, and silicon dioxide ($SiO_2$) isolation layers 106 formed (for example, by a LOCal Oxidation of Silicon [LOCOS] technique) on the surface of the semiconductor substrate 102. Overlying the n-type collector precursor region 104 are an n-type in-situ doped epitaxial layer 108 (which will become part of a final NPN BJT collector region) and a p-type in-situ doped epitaxial base layer 110. Polysilicon layers 112 and 114, formed during deposition of the n-type in-situ doped epitaxial layer 108 and the P-type in-situ doped epitaxial base layer 110, respectively, over the $SiO_2$ isolation layers. An idealized dopant concentration depth profile for n-type in-situ doped epitaxial layer 108 and P-type in-situ doped epitaxial base layer 110 is illustrated in FIG. 2.

FIG. 3 is a cross-sectional representation of a portion of an NPN HBT 200 that includes a semiconductor substrate 202, an n-type collector precursor region 204 formed on the surface of the semiconductor substrate 202, and silicon dioxide ($SiO_2$) isolation layers 206 formed on the surface of the semiconductor substrate 202. Overlying the n-type collector precursor region 204 are an n-type in-situ doped epitaxial layer 208 (which will become part of the NPN HBT's collector region) and an epitaxially grown SiGe layer (doped or undoped) with Boron doped cap layer 210. Polysilicon layers 212 and 214, formed during the epitaxial deposition of layers 208 and 210, respectively, over the $SiO_2$ isolation layers. An idealized dopant concentration depth profile for n-type in-situ doped epitaxial layer 208 and p-type in-situ doped epitaxial base layer 210 is illustrated in FIG. 4. Structure 200 is similar to structure 100, however, it further includes a graded $Si_{1-x}Ge_x$ region starting at the end of the layer 208 (N-type epi).

FIG. 5 is a Secondary Ion Mass Spectroscopy (SIMS) dopant (boron and phosphorus) concentration depth profile of an actual structure with a n-type (i.e. phosphorous) in-situ doped epitaxial layer and a p-type (i.e. boron) in-situ doped epitaxial base layer. The arrow at a depth of approximately 1580 angstroms indicates the location where the formation of the n-type (i.e. phosphorous) in-situ doped epitaxial layer began. The arrow at a depth of approximately 575 angstroms indicates the point where the phosphorus dopant source was turned off and the formation of the p-type (i.e. boron) in-situ doped epitaxial base layer began. These actual dopant concentration depth profiles in FIG. 5 correspond to the idealized dopant concentration depth profiles of FIG. 2. As shown in FIG. 5, the phosphorous dopant concentration depth profile does not decrease to zero (as in the idealized dopant concentration depth profile of FIG. 2) even though the phosphorus dopant source was turned off at the start of the formation of the p-type in-situ doped epitaxial base layer. Instead, it tends to increase due to n-type dopant (i.e. phosphorus) accumulation in the overlying p-type layer. Similar n-type dopant accumulation behavior has been observed when a graded $Si_{1-x}Ge_x$ region is present at the epitaxial base layer. As is explained immediately below, this uncontrolled accumulation of n-type dopants in epitaxial layers formed subsequent to (and, therefore, overlying) a P-type in-situ doped epitaxial layer is undesirable for high performance bipolar transistor applications.

It is desirable, with respect to increasing the frequency performance of bipolar transistors, to minimize the collector-base junction capacitance ($C_{cb}$) by reducing the dopant concentration at the collector. This is desirable since minimizing $C_{cb}$ increases the maximum oscillation frequency ($f_{max}$). Also to increase $F_t$ of transistors, the base transit time can greatly be reduced by increasing the base doping. High base doping also increases $C_{cb}$ cap and lowers the gain of the transistor. To optimize this situation, it is desirable to have a low collector doping and less compensation of the base P-type dopant by the N-type collector dopant. To minimize $C_{cb}$ in NPN bipolar transistors where epitaxial layers (i.e. either a p-type in-situ doped epitaxial base layer in the case of an BJT or an undoped $Si_{1-x}Ge_x$ epitaxial layer in the case of a HBT) are deposited subsequent to formation of n-type in-situ doped epitaxial layer that will become part of the transistor's collector region, the n-type dopant concentration depth profile in these subsequently formed epitaxial layers should be less than, or equal to, that in the n-type in-situ doped epitaxial layer. That is, $C_{cb}$ in NPN bipolar transistors is minimized if the n-type dopant concentration depth profile in the underlying n-type in-situ doped epitaxial layer (i.e. a precursor to the transistor's collector region) exceeds the n-type dopant concentration depth profile in the subsequently deposited p-type in-situ doped epitaxial base layer in a BJT (or undoped $Si_{1-x}Ge_x$ epitaxial layer in a HBT). For example, if the level of phosphorous dopant concentration in an n-type in-situ doped epitaxial layer is 2e17 atoms/cm$^3$, then the phosphorous dopant concentration level in subsequently formed epitaxial layers (such as a p-type in-situ doped epitaxial base layer or an undoped $Si_{1-x}Ge_x$ epitaxial layer) due to the accumulation of such dopant therein should be no greater than 2e17 atoms/cm$^3$. The ideal situation would be where the n-type dopant concentration at the collector-base junction inside the base region becomes zero (as in FIGS. 2 and 4). However, as shown by the actual data in FIG. 5, phosphorus (an n-type dopant) can accumulate in subsequently formed epitaxial layers to concentration levels that are higher than the concentration of phosphorus dopant remaining in the n-type in-situ doped epitaxial layer itself, even though the phosphorus dopant source was turned off (i.e. there was no intentional doping with n-type dopants) when the subsequent formation of the epitaxial layers began.

It is theorized, without being bound, that the accumulation of n-type dopants in epitaxial layers deposited subsequent to the formation of an n-type in-situ doped epitaxial layer is due to n-type dopant segregation at the interface during deposition of the subsequent layers. This segregation of phosphorus is not due to out-diffusion resulted from growth temperature (the growth temperature being very low). Also, this is not a result of memory effect in the reactor (even 13 minutes purge between the growth did not reduce the phosphorus pile-up in the subsequent P-type layer). It is indeed a leaching/segregation effect associated with advancing epi front. Independent of the cause of this unwanted accumulation, however, processes according to the present invention provide for the formation of NPN bipolar transistor epitaxial layers, including undoped and p-type doped epitaxial layers formed subsequent to an n-type in-situ doped epitaxial layer, wherein the n-type dopant concentration depth profile in the p-type doped epitaxial layers is controlled and minimized. Up to an order of magnitude or greater reduction of the accumulated n-type dopant concentration depth profile levels in the p-type doped epitaxial layers, in comparison to conventional methods, can be obtained using processes according to the present invention.

Processes in accordance with the present invention provide for the formation of epitaxial layers with controlled n-type dopant concentration depth profiles for use in NPN bipolar transistors (both BJTs and HBTs). The processes include first providing a semiconductor substrate (e.(g. a [100]-oriented silicon wafer substrate) with an n-type collector precursor region formed on its surface. Next, an n-type (e.g. phosphorous or arsenic) in-situ doped epitaxial layer of a first thickness $t_1$ is formed on the n-type collector precursor region, followed by the formation of an undoped epitaxial layer of a second thickness $t_2$ on the n-type in-situ doped epitaxial layer, as well as the formation of a p-type (e.g. boron) in-situ doped epitaxial base layer over the undoped epitaxial layer. Through out the specification, the term "undoped epitaxial layer" refers to epitaxial layers that are not intentionally doped (i.e. dopant sources are turned off during the formation of the subjected epitaxial layers), although the layers may contain accumulated dopants that are segregated from the underlying layers (as explained with reference to FIG. 5 above). The accumulated n-type dopant concentration in a p-type in-situ doped epitaxial base layer formed is controlled by the adjusting the thickness ratio of the latter two layers (i.e. $t_2$ to $t_1$).

Processes according to the present invention can also be applicable for SiGe epi process for heterojunction bipolar transistor. Just splitting the N-layer growth into two regions; one with in-situ phosphorus doped ($t_1$) layer and subsequent undoped ($t_2$) layer. By controlling the ratio of $t_2$ to $t_1$, the pile-up N-dopant into the subsequent SiGe and SiGe with boron doped layers can be controlled.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

Figure 1:
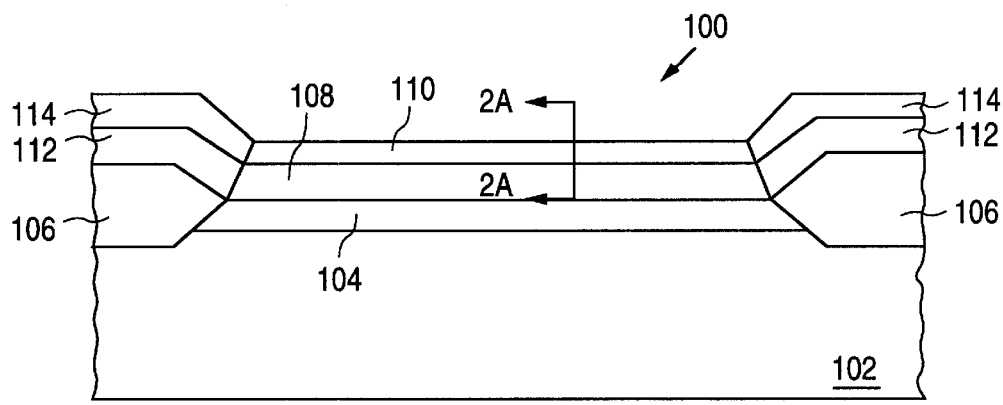
FIG. 1 is a cross-sectional depiction of a portion of an NPN BJT.
Figure 2:
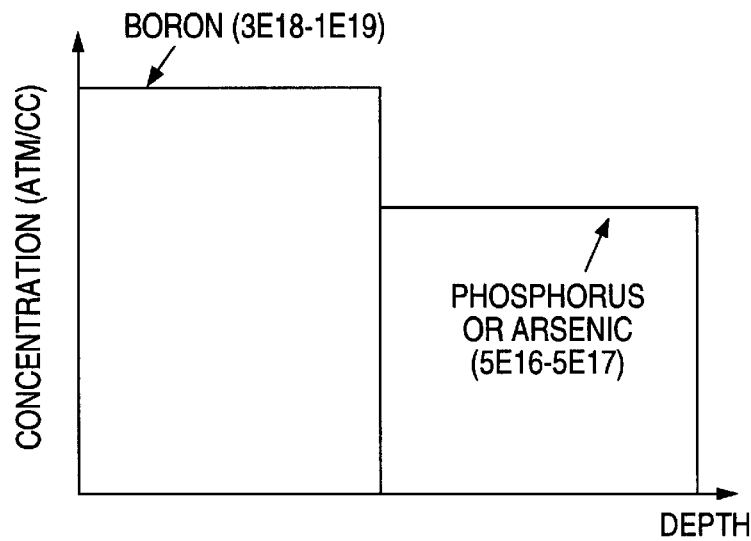
FIG. 2 is an idealized dopant concentration depth profile along line 2A—2A of FIG. 1.
Figure 3:
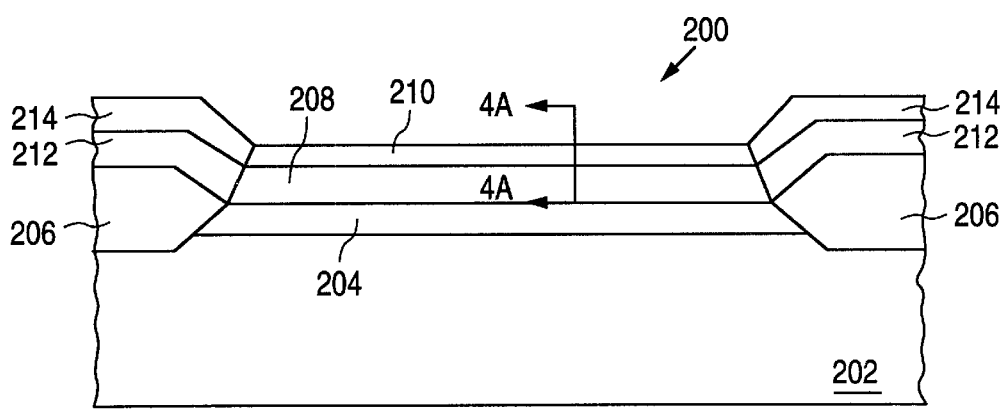
FIG. 3 is a cross-sectional depiction of a portion of an NPN HBT.
Figure 4:
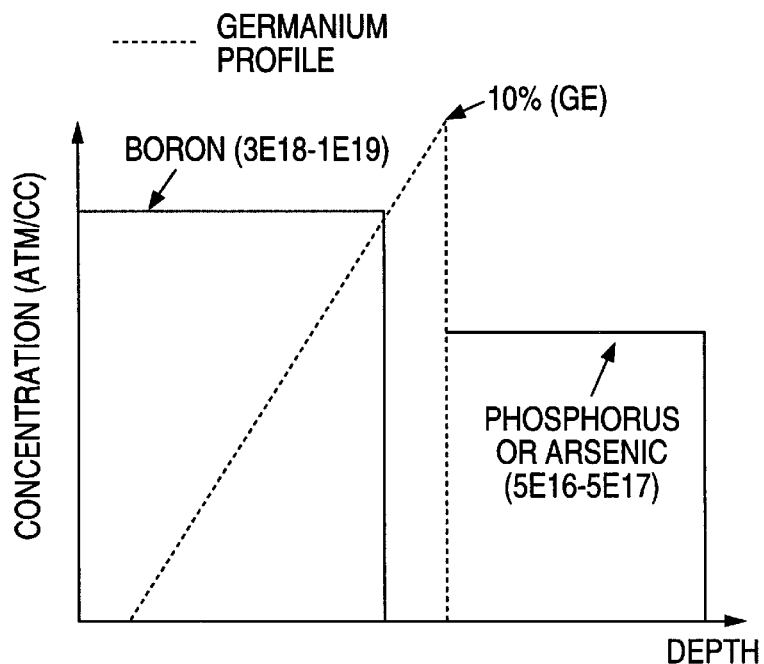
FIG. 4 is a an idealized dopant concentration depth profile along line 4A—4A of FIG. 3.
Figure 5:
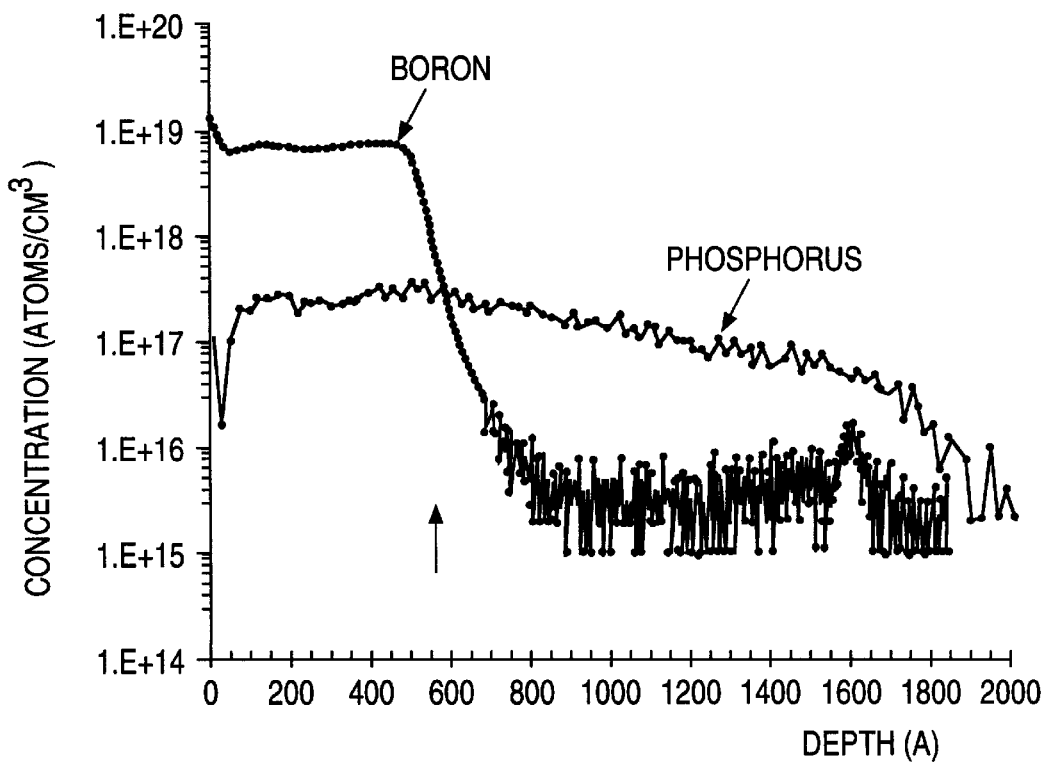
FIG. 5 is a SIMS boron and phosphorus dopant concentration depth profile for a portion of an actual NPN BJT formed by depositing a boron in-situ doped epitaxial base layer on a phosphorus in-situ doped epitaxial layer.
Figure 6:
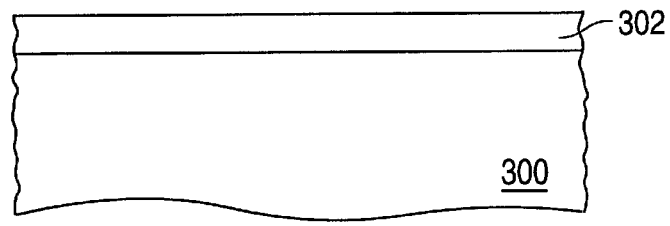
FIGS. 6–9 are cross-sectional views illustrating stages in a process in accordance with the present invention.

FIGS. 6–9 illustrate various stages of a process for forming epitaxial layers with a controlled n-type dopant concentration depth profile according to the present invention. Referring to FIG. 6, the process first includes a step of providing a semiconductor substrate (i.e. a silicon substrate, for example of [100]-orientation) 300 with an n-type collector precursor region 302 on the substrate. Semiconductor substrate 300 can be a silicon wafer at any stage during the fabrication of a semiconductor device, including those stages where multiple patterned and/or unpatterned layers (such as an $SiO_2$ isolation layer formed by LOCOS techniques) are on the surface of the wafer in addition to the n-type collector precursor region 302.

Figure 7:
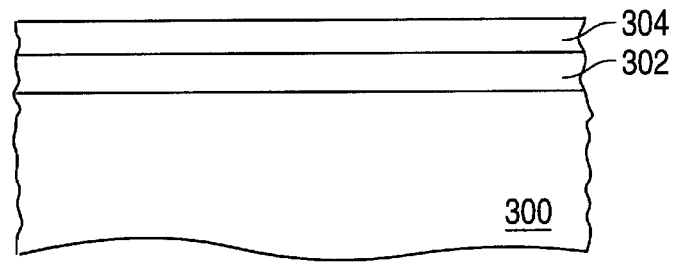

An n-type in-situ doped epitaxial layer 304 is then formed on the n-type collector precursor region 302. N-type in-situ doped epitaxial layer 304 is, by definition, a crystalline silicon layer since the term "epitaxial layer" refers to those layers that are formed by growing a crystalline silicon layer on a crystalline substrate layer (e.g. n-type collector precursor region 302). The resulting structure is illustrated in FIG. 7. The formation of n-type in situ doped epitaxial layer 304 can be conducted using Low Pressure Chemical Vapor Deposition (LPCVD), Reduced Pressure Chemical Vapor Deposition (RPCVD), or Ultra-High Vacuum Chemical Vapor Deposition (UHVCVD) techniques that are well known to those skilled in the art. Typical RPCVD epitaxial reaction growth conditions include the silane source as a silane ($SiH_4$) with flow of 1 slm, a carrier gas hydrogen ($H_2$) with flow of 20 slm and N-type dopant source as a phosphine ($PH_3$) at a pressure of 40 Torr and a temperature of 750° C. Typical UHVCVD techniques would be conducted at a lower temperature (i.e. 400° C. to 600° C.) and a pressure in the 0.5 to 10 mTorr range. The thickness $t_1$ of n-type in-situ doped epitaxial layer 304 is technology dependent. A typical range for thickness $t_1$ would, however, be 125 angstroms to 1000 angstroms, with 250 angstroms being a representative value.

N-type in-situ doped epitaxial layer 304 is referred to as an "in-situ" doped layer since a dopant gas is employed during its formation as a means of introducing n-type dopant (e.g. phosphorus) therein. A typical phosphorus dopant concentration range in the layer, prior to the formation of any overlying epitaxial layers, is 5e16 atoms/cm³ to 5e17 atoms/cm³. However, a typical phosphorus dopant concentration in the same layer at the conclusion of processes (i.e. subsequent to the formation of overlying layers) in accordance with the present invention becomes 1e17 atoms/cm³ to 2e17 atoms/cm³. It should be noted that n-type in-situ doped epitaxial layer 304 is intended, at some point of semiconductor manufacturing outside the scope of this invention, to become part of an n-type collector of a final NPN bipolar transistor by merging with the n-type collector precursor region 302.

Figure 8:
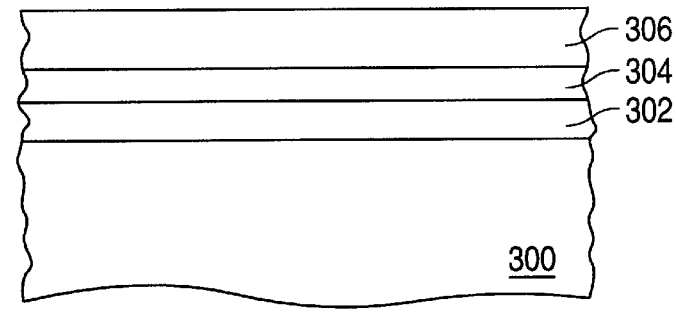

Next, an undoped epitaxial layer 306 of a thickness $t_2$ is formed. This layer is referred to as an "undoped" layer since it is formed without the use of a dopant source and is, therefore, not intentionally doped. Any dopants contained in such "undoped" layers at the conclusion of processes in accordance with the present invention is a result of the dopant accumulation/segregation from the underlying n-type in-situ doped epitaxial layer. Undoped epitaxial layer 306 can be formed using LPCVD, RPCVD and UHVCVD techniques. Typical RPCVD epitaxial reaction growth conditions include the silane source as a silane ($SiH_4$) with flow of 1 slm, a carrier gas hydrogen ($H_2$) with flow of 20 slm and N-type dopant source as a phosphine ($PH_3$) at a pressure of 40 Torr and a temperature of 750° C. FIG. 8 illustrates the resultant structure in a cross-sectional view. The thickness ($t_2$) of undoped epitaxial layer 306 is about two (2) to four (4) times greater than the thickness ($t_1$) of the n-type in-situ doped epitaxial layer 304. Thus, when a representative value of $t_1$ is 250 angstroms, $t_2$ is approximately 500 to 1000 angstroms, with 750 angstroms being a representative thickness.

The thickness ($t_1$) of the n-type in-situ doped epitaxial layer 304 and the thickness ($t_2$) of the undoped epitaxial layer 306 are selected to insure that a desired n-type dopant concentration depth profile is obtained in the epitaxial layers. The thickness of N-layer is kept constant at t (i.e. $t_1+t_2$). As described earlier, it is often desirable to insure that the accumulated n-type dopant concentration in epitaxial layers that are deposited subsequent to an n-type in-situ doped epitaxial layer are less than or equal to the n-type dopant concentration remaining in the n-type in-situ doped epitaxial layer at the conclusion of the process. This desirable n-type dopant concentration depth profile can be obtained using processes according to the present invention when $t_2$ is two (2) to four (4) or more times greater than $t_1$. When $t_1$ is three (3) times $t_1$, the n-type dopant concentration depth profile will be relatively flat across the interface between the undoped epitaxial layer and a subsequently deposited epitaxial layer.

Figure 9:
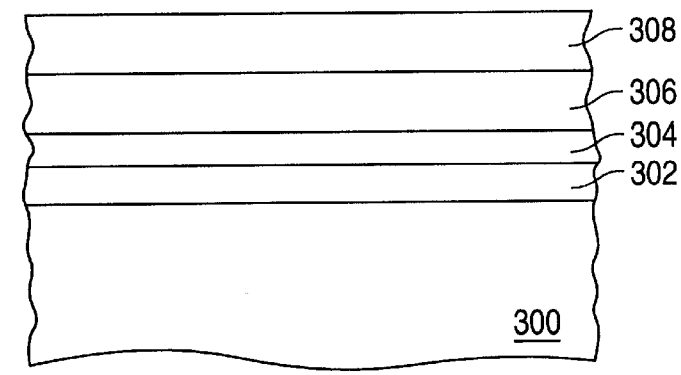

A p-type in-situ doped epitaxial base layer 308 is then formed on the undoped epitaxial layer 306, as shown in FIG. 9. P-type in-situ doped epitaxial base layer 308 can be formed using LPCVD, RPCVD and UHVCVD techniques. Typical RPCVD epitaxial reaction conditions are a silane ($SiH_4$) flow of 1 slm, a hydrogen ($H_2$) flow of 20 slm and a p-type dopant source gas (such as diborane [$B_2H_6$]) at a pressure of 40 Torr and a temperature of 750° C. While the thickness and p-type doping levels of p-type in-situ doped epitaxial base layer 308 are technology dependent, a typical thickness range for the p-type in-situ doped epitaxial base layer 308 is from 100 angstroms to 500 angstroms, while a typical dopant concentration range for boron is from 3e18 atoms/cm³ to 5e19 atoms/cm³.

The following example illustrates how processes in accordance with the present invention provide for controlling the accumulation of n-type dopant concentration in p-type in-situ doped epitaxial base layers that are formed subsequent to an n-type in-situ doped epitaxial layer:

EXAMPLE 1

Figure 10:
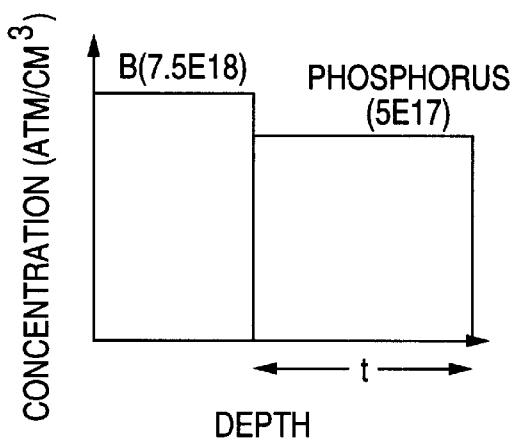
FIG. 10 is an idealized dopant concentration depth profile for bipolar transistor epitaxial layers formed by depositing a boron in-situ doped epitaxial base layer on a phosphorous in-situ doped epitaxial layer.
Figure 11:
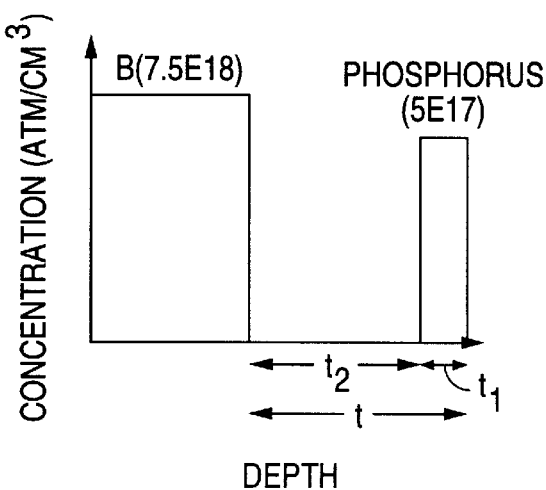
FIG. 11 is an idealized dopant concentration depth profile for bipolar transistor epitaxial layers formed by a process according to the present invention that includes depositing a boron in-situ doped epitaxial base layer on an undoped epitaxial layer that was itself deposited on a phosphorus in-situ doped epitaxial layer.

Two separate epitaxial layer samples were provided for comparison: sample A was created by depositing a p-type (boron) in-situ doped epitaxial base layer directly on an n-type (phosphorus) in-situ-doped epitaxial layer, while Sample B was created by a process in accordance with the present invention by first depositing an n-type (phosphorus) in-situ doped epitaxial layer, followed by the deposition of an undoped epitaxial layer and then a p-type in-situ doped epitaxial base layer. In sample B, the undoped epitaxial layer thickness $t_2$ is approximately 3 times the n-type in-situ doped epitaxial layer thickness $t_1$. The idealized dopant concentration depth profile for sample A is represented in FIG. 10, while that for sample B is represented in FIG. 11. All of the layers were deposited in a 200 mm commercially available single wafer reactor (ASM Epsilon-1 E2). This reactor is a cold-wall radiantly heated chamber where the wafer is placed on a SiC coated graphite susceptor. $SiH_4$ was used as the silicon source, $PH_3$ as the N-type source gas, and $B_2H_6$ as the P-type source gas. The deposition temperature was 750° C. (100)-orientation silicon substrates were used.

Figure 12:
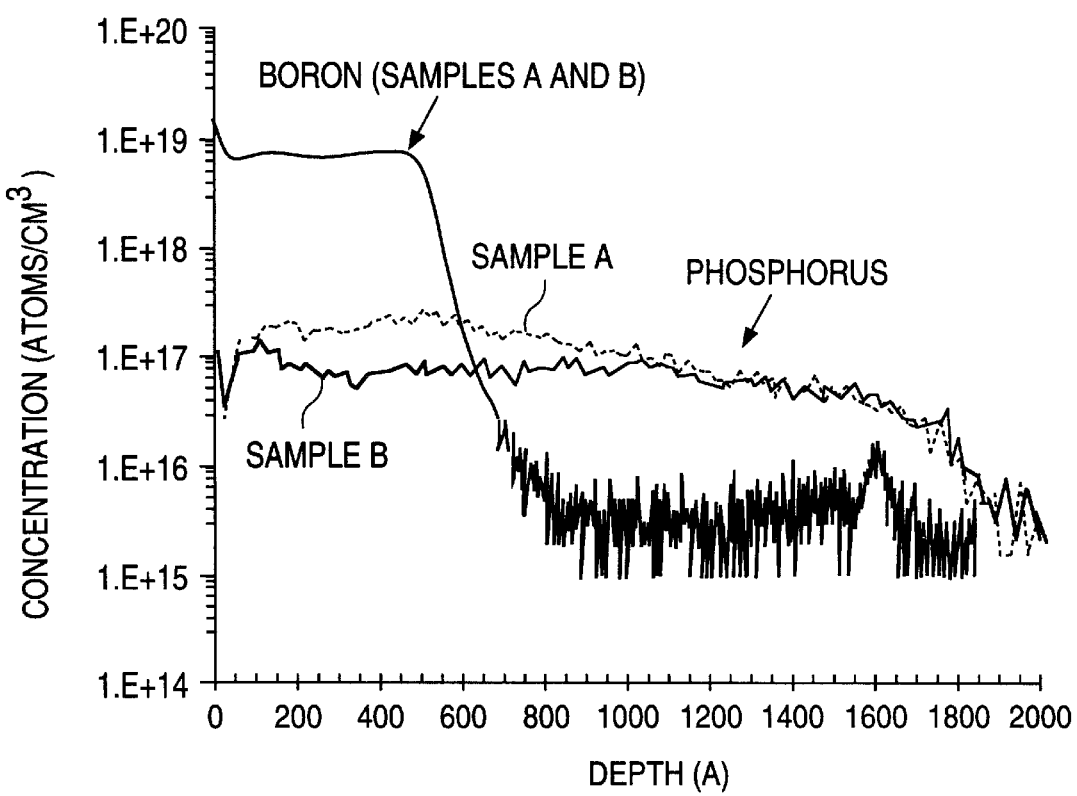
FIG. 12 depicts SIMS boron and phosphorus dopant concentration depth profiles for bipolar transistor epitaxial layers formed by (i) the process described with respect to FIG. 10 and (ii) the process described with respect to FIG. 11.

The SIMS dopant concentration depth profiles of boron and phosphorus dopants for samples A and B are shown in FIG. 12. The dopant concentration depth profiles for sample A (with no undoped epitaxial layer) indicate that n-type dopant (i.e. phosphorus) has accumulated in the subsequently formed p-type (boron) in-situ doped epitaxial base layer to levels that are higher than the levels in the underlying n-type in-situ doped epitaxial layer. However, the dopant concentration depth profiles for sample B (with an undoped epitaxial layer), which was created by a process in accordance with the present invention, indicate that the n-type (phosphorus) dopant has accumulated in the subsequently formed p-type (boron) in-situ doped epitaxial base layer only to a level that is essentially equal to or less than that of the immediately underlying epitaxial layer (i.e. the undoped epitaxial layer). As described earlier, the dopant concentration depth profile at the interface between a p-type in-situ doped epitaxial base layer and an underlying epitaxial layer is crucial in creating a high-performance bipolar transistor. The desired dopant concentration depth profile is one in which the n-type dopant concentration is lower in the p-type in-situ doped epitaxial base layer than in the underlying epitaxial layer, or in which the n-type dopant concentration is level at the interface. Sample B, created in accordance with the present process, provides such a desirable n-type dopant concentration depth profile.

Figure 13:
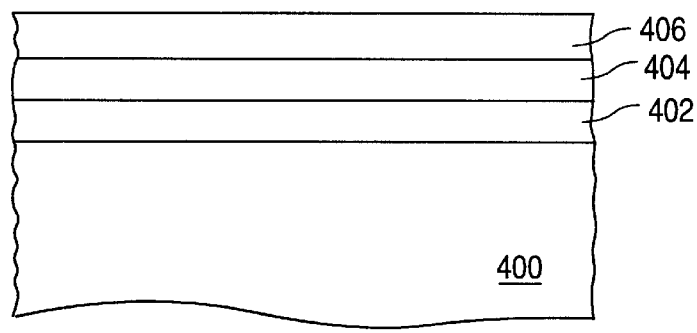
FIGS. 13–16 are cross-sectional views illustrating stages in another process embodiment in accordance with the present invention.

FIGS. 13–16 illustrate stages of another embodiment of a process according to the present invention. Referring to FIG. 13, the process steps first include providing a semiconductor substrate 400 with an n-type collector precursor region 402 on the semiconductor substrate, followed by depositing an n-type in-situ doped epitaxial layer 404 on the n-type collector precursor region 402. Although the thickness ($t_1$) of n-type in-situ doped epitaxial layer 404 is technology dependent, a typical thickness $t_1$ range would be 125 angstroms to 1000 angstroms, with 250 angstroms being a representative value. Next, an undoped epitaxial layer 406 of a thickness $t_2$ is formed. The thickness of N-layer is kept constant at t (i.e. $t_1+t_2$). N-type in-situ doped epitaxial layer 404 and undoped epitaxial layer 406 can be formed by the same methods used for the aforementioned embodiment.

Figure 14:
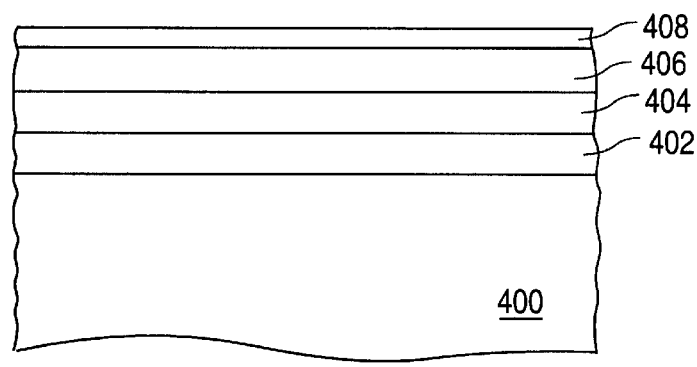

Next, undoped $Si_{1-x}Ge_x$ epitaxial layer 408 is formed on the undoped epitaxial layer 406, as illustrated in FIG. 14, using conventional techniques, such as RPCVD. Typical RPCVD epitaxial reaction conditions for the formation of the undoped $Si_{1-x}Ge_x$ epitaxial layer are a silane ($SiH_4$) flow of 1 slm, a hydrogen ($H_2$) flow of 20 slm and a ramped germane ($GeH_4$) flow at a temperature of 700° C. and a pressure of 40 Torr. While the thickness of undoped $Si_{1-x}Ge_x$ epitaxial layer 408 is technology dependent, a typical thickness range is from 100 angstroms to 300 angstroms.

Figure 15:
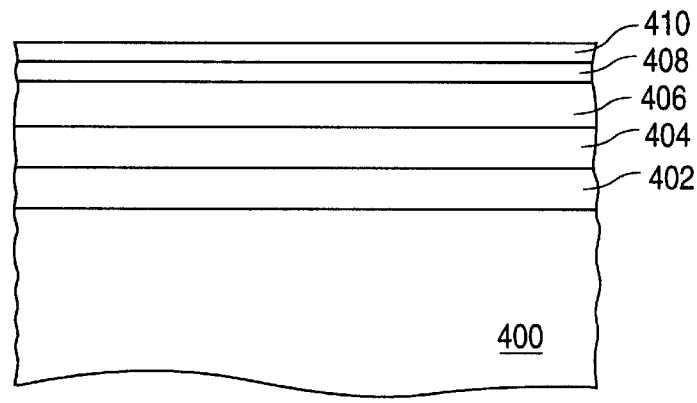
Figure 16:
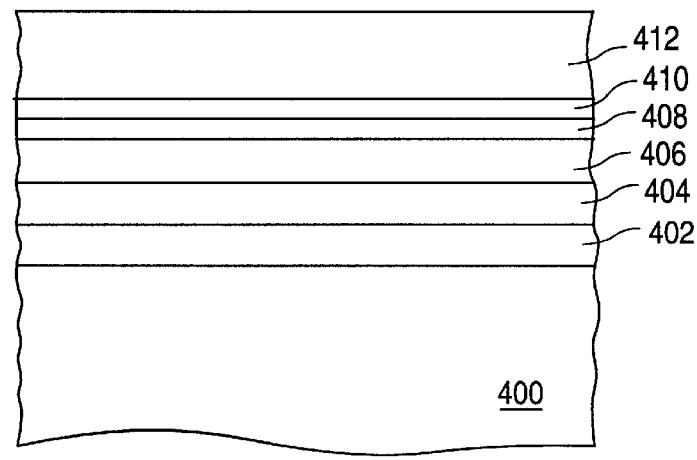

A p-type in-situ doped $Si_{1-x}Ge_x$ epitaxial layer 410 is subsequently formed on the undoped $Si_{1-x}Ge_x$ epitaxial layer 408, using conventional techniques, such as RPCVD. Typical RPCVD epitaxial reaction conditions for the p-type in-situ doped $Si_{1-x}Ge_x$ epitaxial layer 410 formation are a silane ($SiH_4$) flow of 1 slm, a hydrogen ($H_2$) flow of 20 slm, a ramped germane ($GeH_4$) flow and a p-type dopant source (such as diborane) at a temperature of 700° C. and a pressure of 40 Torr. Although the typical thickness range of p-type in-situ doped $Si_{1-x}Ge_x$ epitaxial layer 410 is from 200 angstroms to 500 angstroms, a thickness outside this range can be used depending on the transistor technology in which the epitaxial layer will be employed. The p-type (e.g. boron) dopant concentration level in the p-type in-situ doped $Si_{1-x}Ge_x$ epitaxial layer is typically in the range of 3e18 atoms/$cm^3$ to 5e19 atoms/$cm^3$. The resultant structure is illustrated in FIG. 15.

Figure 18:
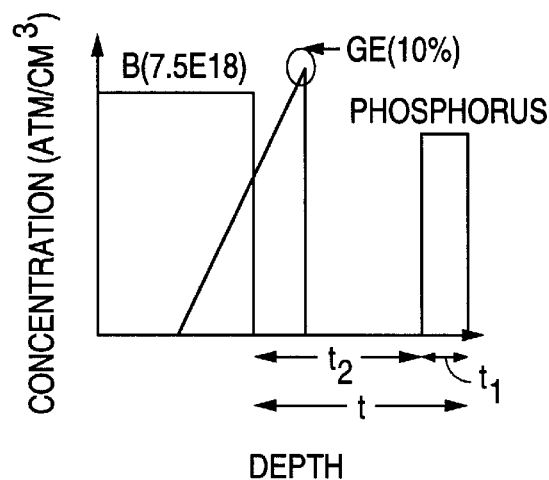
FIG. 18 is an idealized dopant concentration depth profile for bipolar transistor epitaxial layers formed by a process in accordance with the present invention that includes sequentially forming a phosphorous in-situ doped epitaxial layer, an undoped epitaxial layer, an undoped graded $Si_{1-x}Ge_x$ epitaxial layer, a boron in-situ doped graded $Si_{1-x}Ge_x$ epitaxial base layer, and a boron in-situ doped epitaxial base layer.

Germanium is employed as it is known to shift the band gap of an epitaxial layer (in comparison to silicon alone), which in turn enhances the speed of a bipolar transistor that includes a $Si_{1-x}Ge_x$ epitaxial layer (see D. L. Harame, et al., Si/SiGe Epitaxial-Base Transistors-Part I: Materials, Physics, and Circuits, in *IEEE Transactions on Electron Devices*, Vol. 42, No. 3, pp. 455–486 [March, 1995] and D. L. Harame, et al., Si/SiGe Epitaxial-Base Transistors-Part II: Process Integration and Analog Applications, in *IEEE Transactions on Electron Devices*, Vol. 42, No. 3, pp. 469–482 [March, 1995]). The germanium concentration depth profile across the undoped $Si_{1-x}Ge_x$ epitaxial layer 408 and the p-type in-situ doped $Si_{1-x}Ge_x$ epitaxial layer 410 is typically graded, namely it starts at zero percent in the p-type in-situ doped $Si_{1-x}Ge_x$ epitaxial layer 410 and is increased to a maximum of 8–14 percent in the undoped $Si_{1-x}Ge_x$ epitaxial layer 408, as illustrated in FIG. 18.

Next, a p-type in-situ doped epitaxial base layer 412 is formed on the p-type in-situ doped $Si_{1-x}Ge_x$ epitaxial layer 410 using conventional techniques, such as RPCVD. Typical RPCVD epitaxial reaction conditions for the formation of p-type in-situ doped epitaxial base layer 412 are a silane ($SiH_4$) flow of 1 slm, a hydrogen ($H_2$) flow of 20 slm and a p-type dopant source gas (e.g. diborane [$B_2H_6$]) at a pressure of 40 Torr and a temperature of 750° C. A cross-sectional illustration of the resultant structure is provided in FIG. 16. The typical thickness range for the p-type in-situ doped epitaxial base layer 412 is from 100 angstroms to 300 angstroms and a typical dopant concentration for boron is from 3e18 atoms/$cm^3$ to 5e19 atoms/$cm^3$.

The following example illustrates how processes in accordance with the present invention provide for controlling the accumulation of n-type dopant concentration in p-type in-situ doped graded $Si_{1-x}Ge_x$ epitaxial layers that are formed subsequent to an n-type in-situ doped epitaxial layer:

EXAMPLE 2

Figure 17:
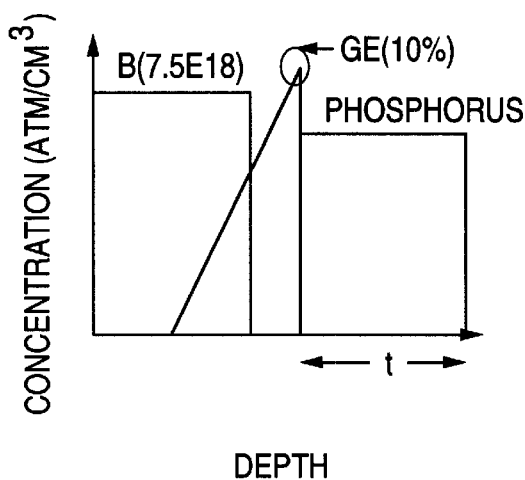
FIG. 17 is an idealized dopant concentration depth profile for bipolar transistor epitaxial layers formed by sequentially forming a phosphorous in-situ doped epitaxial layer, an undoped graded $Si_{1-x}Ge_x$ epitaxial layer, a boron in-situ doped graded $Si_{1-x}Ge_x$ epitaxial base layer, and a boron in-situ doped epitaxial base layer.

Two separate epitaxial layer samples were created for comparison: sample C was created by sequentially forming a n-type (phosphorus) in-situ doped epitaxial layer (during the whole N-layer growth phosphorus dopants were turned on), an undoped graded $Si_{1-x}Ge_x$ epitaxial layer, a p-type (boron) in-situ doped graded $Si_{1-x}Ge_x$ epitaxial layer and a boron in-situ doped epitaxial base layer, while sample D was created by a process in accordance with the present invention by sequentially forming an n-type (phosphorus) in-situ doped epitaxial layer, an undoped epitaxial layer, an undoped graded $Si_{1-x}Ge_x$ epitaxial layer, a p-type (boron) in-situ doped graded $Si_{1-x}Ge_x$ epitaxial layer and a p-type (boron) in-situ doped epitaxial base layer. In sample D, the undoped epitaxial layer thickness $t_2$ is approximately 3 times the n-type in-situ doped epitaxial layer thickness $t_1$. The idealized dopant concentration depth profile for sample C is represented in FIG. 17, while that for sample D is represented in FIG. 18.

Figure 19:
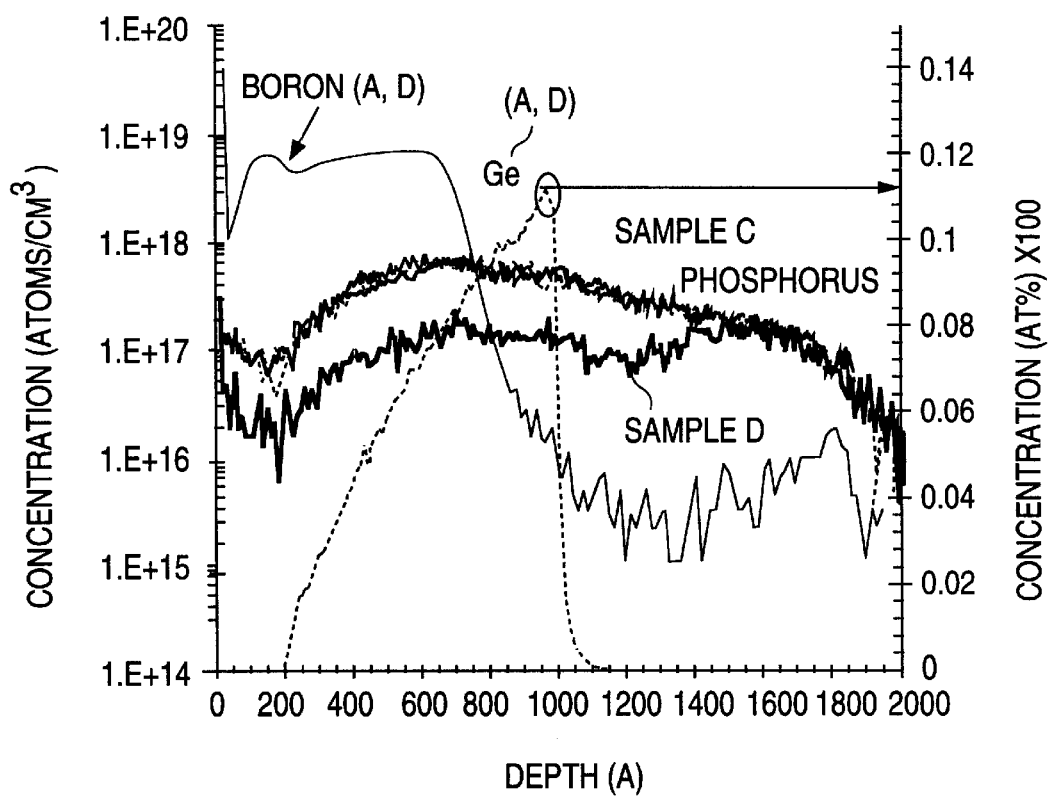
FIG. 19 depicts SIMS boron, phosphorus and germanium concentration depth profiles for bipolar transistor epitaxial layers formed by (i) the process described with respect to FIG. 17 and (ii) the process described with respect to FIG. 18.

All of the layers were deposited in the same reactor, using the same reaction conditions as in the Example 1. The SIMS dopant concentration depth profiles of boron and phosphorus dopants, as well as germanium, for samples C and D are shown in FIG. 19. FIG. 19 also shows two additional phosphorus concentration depth profiles of sample C where an extended inert gas purge step of different durations (3 minutes to 30 minutes) was added between the deposition of the n-type in-situ doped epitaxial layer and the undoped SiGe epitaxial layer. The inert gas purge step was ineffective in altering the phosphorus dopant concentration depth profile, as apparent from the almost complete overlap of these two additional profiles with the original profile for sample C, which was produced with a very short (30 seconds) inert gas purge step.

The SIMS dopant concentration depth profiles of boron and phosphorus dopants, as well as germanium, for samples C and D are shown in FIG. 19. The dopant concentration depth profiles for sample C indicate that n-type dopant (i.e. phosphorus) has accumulated in the subsequently formed p-type (boron) epitaxial layers (i.e. both the p-type in-situ doped graded $Si_{1-x}Ge_x$ epitaxial layer and p-type in-situ doped epitaxial base layer) to levels that are higher than the levels in the immediately underlying epitaxial layer (i.e. the undoped graded $Si_{1-x}Ge_x$ epitaxial layer). On the other hand, the dopant concentration depth profiles for sample D, which was created by a process in accordance with the present invention, the n-type (phosphorus) dopant has accumulated in these subsequently formed p-type (boron) epitaxial layers only to a level that is essentially equal to or less than that of the immediately underlying epitaxial layer. Since the dopant concentration depth profile at the interface between a p-type epitaxial layer and an underlying non-p-type epitaxial layer is critical in creating a high-performance bipolar transistor, the desired dopant concentration depth profile is one in which the n-type dopant concentration is lower in the p-type epitaxial layers than in the underlying non-p-type epitaxial layer (i.e. the undoped graded $Si_{1-x}Ge_x$ epitaxial layer), or in which the n-type dopant concentration is level at the interface. Sample D, created in accordance with the present process, provides such a desirable n-type dopant concentration depth profile.

It should be understood that various alternatives to the embodiments of the invention described herein may be employed in practicing the invention. It is intended that the following claims define the scope of the invention and that processes within the scope of these claims and their equivalents be covered thereby.

What is claimed is:

1. A method of forming epitaxial layers with controlled n-type dopant concentration depth profiles for use in an NPN bipolar transistor, the method comprising:

providing a semiconductor substrate with an n-type collector precursor region formed thereon;

forming an n-type in-situ doped epitaxial layer on the n-type collector precursor region;

forming an undoped epitaxial layer on the n-type in-situ doped epitaxial layer; and forming a p-type in-situ doped epitaxial base layer on the undoped epitaxial layer;

wherein the n-type dopant concentration depth profile in the p-type in-situ doped epitaxial base layer is controlled by a thickness ratio of the undoped epitaxial layer to the n-type in-situ doped epitaxial layer, while keeping the total thickness of the n-type in-situ doped epitaxial layer combined and the undoped epitaxial layer fixed; and wherein the step of forming an undoped epitaxial layer includes forming an undoped epitaxial layer of a thickness 2 to 4 times greater than a thickness of the n-type in-situ doped epitaxial layer.

2. A method of forming epitaxial layers with controlled n-type dopant concentration depth profiles for use in an NPN bipolar transistor, the method comprising the:

providing a semiconductor substrate with an n-type collector precursor region formed thereon;

forming an n-type in-situ doped epitaxial layer on the n-type collector precursor region;

forming an undoped epitaxial layer on the n-type in-situ doped epitaxial layer; and forming a p-type in-situ doped epitaxial base layer on the undoped epitaxial layer;

wherein the n-type dopant concentration depth profile in the p-type in-situ doped epitaxial base layer is controlled by a thickness ratio of the undoped epitaxial layer to the n-type in-situ doped epitaxial layer, while keeping the total thickness of the n-type in-situ doped epitaxial layer combined and the undoped epitaxial layer fixed; and wherein the step of forming an n-type in-situ doped epitaxial layer includes forming an n-type in-situ doped epitaxial layer of a thickness in the range of 125 angstroms to 1000 angstroms; and wherein the step of forming an undoped epitaxial layer includes forming an undoped epitaxial layer with a thickness in the range of 250 angstroms to 4000 angstroms.

3. The method of claim 2, and wherein the step of forming an n-type in-situ doped epitaxial layer includes forming a phosphorous in-situ doped epitaxial layer; and wherein the step of forming a p-type in-situ doped epitaxial base layer includes forming a boron in-situ doped epitaxial base layer.

4. The method of claim 2, and wherein the step of forming a p-type in-situ doped epitaxial base layer includes forming a p-type in-situ doped epitaxial base layer with an accumulated n-type dopant concentration that is less than or equal to an accumulated n-type dopant concentration in the undoped epitaxial layer.

5. The method of claim 2, and further including, after the step of forming an undoped epitaxial layer and before the step of forming a p-type in-situ doped epitaxial base layer:

forming an undoped $Si_{1-x}Ge_x$ epitaxial layer on the undoped epitaxial layer; and forming a p-type in-situ doped $Si_{1-x}Ge_x$ epitaxial layer on the undoped $Si_{1-x}Ge_x$ epitaxial layer.

6. The method of claim 5, and wherein the step of forming a p-type in-situ doped $Si_{1-x}Ge_x$ epitaxial layer includes forming a boron in-situ doped $Si_{1-x}Ge_x$ epitaxial layer.

7. The method of claim 5, and wherein the step of forming an undoped $S_{1-x}Ge_x$ epitaxial layer includes forming a undoped $Si_{1-x}Ge_x$ epitaxial layer with a graded germanium concentration, and wherein the step of forming a p-type in-situ doped $Si_{1-x}Ge_x$ epitaxial layer includes forming a p-type in-situ doped $Si_{1-x}Ge_x$ epitaxial layer with a graded germanium concentration.

8. The method of claim 5, and wherein the step of forming an undoped $Si_{1-x}Ge_x$ epitaxial layer includes forming an undoped $Si_{1-x}Ge_x$ epitaxial layer with an accumulated n-type dopant concentration that is less than or equal to an accumulated n-type dopant concentration in the undoped epitaxial layer.

9. A method of forming epitaxial layers with controlled n-type dopant concentration depth profiles for use in an NPN bipolar transistor, the method comprising:

provyding a semiconductor substrate with an n-type collector precursor region formed thereon;

forming an n-type in-situ doped epitaxial layer on the n-type collector precursor region;

forming an undoped epitaxial layer on the n-type in-situ doped epitaxial layer;

forming an undoped $Si_{1-x}Ge_x$ epitaxial layer with a graded germanium concentration on the undoped epitaxial layer;

forming a p-type in-situ doped $Si_{1-x}Ge_x$ epitaxial layer with a graded germanium concentration on the undoped graded $Si_{1-x}Ge_x$ epitaxial layer;

forming a p-type in-situ doped epitaxial base layer on the n-type in-situ doped graded $Si_{1-x}Ge_x$ epitaxial layer;

wherein the n-type dopant concentration depth profiles in the undoped graded $Si_{1-x}Ge_x$ epitaxial layer, the p-type in-situ doped graded $Si_{1-x}Ge_x$ epitaxial layer, and the p-type in-situ doped epitaxial base layer are controlled by a thickness ratio of the undoped epitaxial layer to the n-type in-situ doped epitaxial layer.

10. The method of claim 9, and wherein the step of forming a p-type in-situ doped graded $Si_{1-x}Ge_x$ epitaxial layer includes forming a p-type in-situ doped graded $Si_{1-x}Ge_x$ epitaxial layer with an accumulated n-type dopant concentration that is less than or equal to an accumulated n-type dopant concentration in the undoped graded $Si_{1-x}Ge_x$ epitaxial layer.

11. A method of forming epitaxial layers with controlled phosphorous dopant concentration depth profiles for use in an NPN bipolar transistor, the method comprising:

providing a semiconductor substrate with an n-type collector precursor region formed thereon;

forming a phosphorous in-situ doped epitaxial layer on the n-type collector precursor region;

forming an undoped epitaxial layer on the phosphorous in-situ doped epitaxial layer;

forming an undoped $Si_{1-x}Ge_x$ epitaxial layer with a graded germanium concentration on the undoped epitaxial layer;

forming a boron in-situ doped $Si_{1-x}Ge_x$ epitaxial layer with a graded germanium concentration on the undoped graded $Si_{1-x}Ge_x$ epitaxial layer;

forming a boron in-situ doped epitaxial base layer on the boron in-situ doped graded $Si_{1-x}Ge_x$ epitaxial layer;

wherein the phosphorus dopant concentration depth profiles in the undoped graded $Si_{1-x}Ge_x$ epitaxial layer, the boron in-situ doped graded $Si_{1-x}Ge_x$ epitaxial layer, and the boron in-situ doped epitaxial base layer are controlled by a thickness ratio of the undoped epitaxial layer to the phosphorous in-situ doped epitaxial layer.

12. The method of claim 11, and wherein the step of forming a boron in-situ doped graded $Si_{1-x}Ge_x$ epitaxial layer includes forming a boron in-situ doped graded $Si_{1-x}Ge_x$ epitaxial layer with an accumulated phosphorous dopant concentration that is less than or equal to an accumulated phosphorous dopant concentration in the undoped graded $Si_{1-x}Ge_x$ epitaxial layer.

* * * * *